United States Patent
Park et al.

(10) Patent No.: US 7,763,415 B2
(45) Date of Patent: Jul. 27, 2010

(54) METHOD OF FABRICATING SEMICONDUCTOR DEVICE

(75) Inventors: Jeong-Min Park, Seoul (KR); Jang-Soo Kim, Suwon-si (KR); Hi-Kuk Lee, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 938 days.

(21) Appl. No.: 11/430,414

(22) Filed: May 9, 2006

(65) Prior Publication Data

US 2007/0031763 A1   Feb. 8, 2007

(30) Foreign Application Priority Data

Aug. 8, 2005   (KR) .................. 10-2005-0072333

(51) Int. Cl.
*G03F 7/00* (2006.01)
*H01L 21/00* (2006.01)

(52) U.S. Cl. .................. 430/313; 430/311; 430/316; 430/319; 430/330

(58) Field of Classification Search .................. 430/311, 430/313, 316, 319, 330
See application file for complete search history.

(56) References Cited

U.S. PATENT DOCUMENTS

| | | | | |
|---|---|---|---|---|
| 6,380,006 | B2 * | 4/2002 | Kido | 438/149 |
| 6,878,642 | B1 * | 4/2005 | Hsu et al. | 438/759 |
| 6,881,535 | B2 * | 4/2005 | Yamaguchi | 430/321 |
| 7,291,439 | B2 * | 11/2007 | Park et al. | 430/191 |
| 2003/0207195 | A1 * | 11/2003 | Eilbeck et al. | 430/330 |

* cited by examiner

Primary Examiner—Thorl Chea
(74) Attorney, Agent, or Firm—F. Chau & Associates, LLC (57) ABSTRACT

A method of fabricating a semiconductor device is provided. The method includes forming at least one etch target film on a substrate, forming a first reflowable etch mask on the at least one etch target film, patterning the etch target film using the first reflowable etch mask. The method further includes reflowing the first reflowable etch mask to form a second etch mask and patterning the etch target film using the second etch mask.

22 Claims, 11 Drawing Sheets

METHOD OF FABRICATING SEMICONDUCTOR DEVICE

This application claims priority from Korean Patent Application No. 10-2005-72366 filed Aug. 8, 2005 in the Korean Intellectual Property Office, the disclosure of which is incorporated by reference herein in its entirety.

BACKGROUND OF THE INVENTION

1. Field of the Invention

The present invention relates to a method of fabricating a semiconductor device, and more particularly, to a method of fabricating a semiconductor device having an improved patterning technique.

2. Description of the Related Art

Memory cells storing data are typically coupled with a variety of devices. For example, in the case of a dynamic random access memory (DRAM) device, one memory cell includes one transistor and one capacitor. In particular, a DRAM device is made from a combination of memory cells and a variety of interconnection lines. This combination of memory cells and interconnection lines, requires steps for forming an insulating film or a conductive film on a substrate and properly patterning the insulating film or the conductive film. Besides DRAM devices, the above steps are likewise applied to other electronic appliances as well. For example, in the case of a liquid crystal display device (LCD) displaying an image using liquid crystals, a patterning step is needed for forming a thin film transistor, every pixel for the LCD and a variety of interconnection lines on a substrate.

In general, patterning for an etch target film is performed by etching and removing a selected portion of the etch target film. At this stage, an etch mask is formed on the etch target film such that a portion to be removed from the etch target film is exposed by the etch mask. Moreover, the etch mask can be formed by coating a photoresist film and exposing the coated photoresist film to light using a photomask. For example, when multiple layers are formed and patterned with different patterns from each other, photomasks corresponding to the number of the multiple layers used are required. A more detailed discussion regarding the patterning process will now be described with reference to the accompanying drawings.

FIGS. 1A to 1D are sectional views illustrating a process of patterning a film according to the conventional/related art.

Figure 1A:
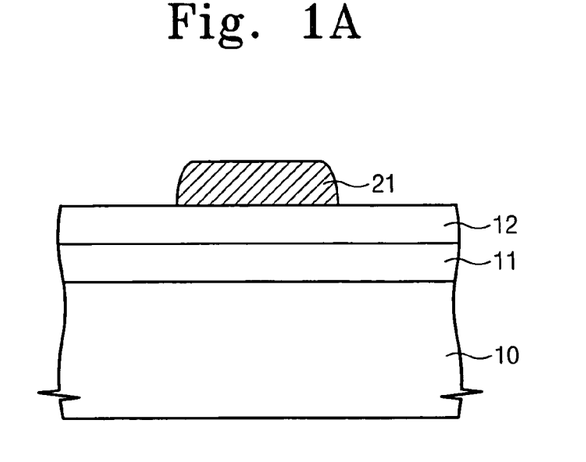
FIGS. 1A to 1D are sectional views illustrating a process of patterning a film according to conventional/related art.

Referring to FIG. 1A, a first etch target film 11 and a second etch target film 12 are formed on a substrate 10. The first and second etch target films 11 and 12 may be composed of a metal film, an insulating film and the like. A first photoresist pattern 21, which is used as an etch mask, is formed on the second etch target film 12. The first photoresist pattern 21 is formed by a conventional photolithography process, which includes coating a photoresist film on the second etch target film 12, thereby exposing the coated photoresist film to light passing through a photomask. The exposed portions are then removed.

Figure 1B:
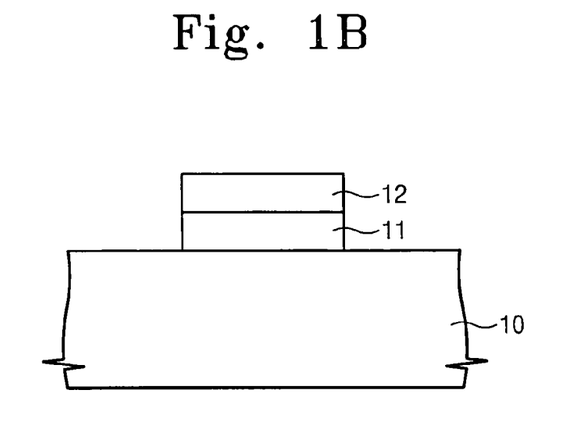

Referring to FIG. 1B, exposed portions of the first etch target film 11 and the second etch target film 12 without the first photoresist pattern 21 thereon are then etched. After the exposed portions are etched, the first photoresist pattern 21 is then stripped. Subsequently, the first and second etch target films 11 and 12 are patterned to correspond to the first photoresist pattern.

Figure 1C:
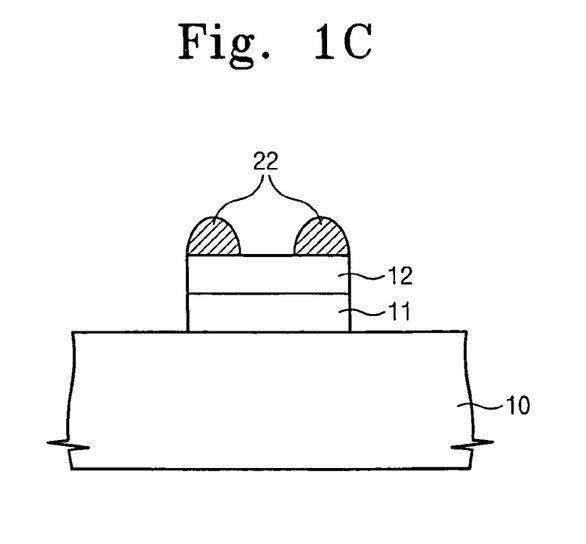

Referring to FIG. 1C, a second photoresist pattern 22 is formed on the second etch target film 12. The second photoresist pattern can be also formed by a conventional photolithography process, which needs a separate photomask.

Figure 1D:
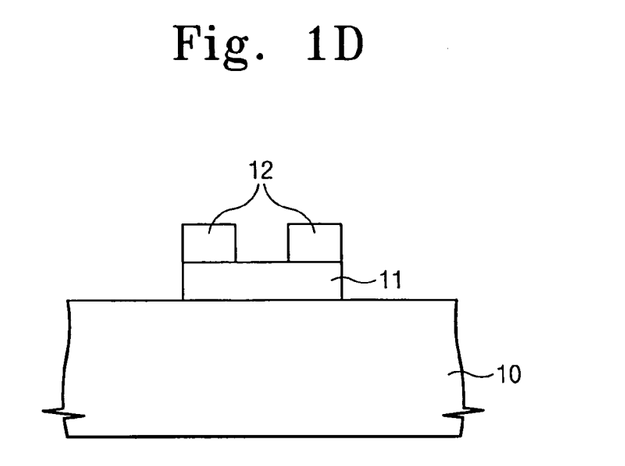

Referring to FIG. 1D, the second etch target film is etched using the second photoresist pattern 22. The second photoresist pattern 22 is then stripped. Next, the first etch target film 11 is patterned corresponding to the first photoresist pattern 21 and the second etch target film 12 is patterned corresponding to the second photoresist pattern 22. Consequently, two different photoresist patterns 21 and 22 are used to pattern the two etch target films 11 and 12, such that etch target films 11, 12 are each patterned differently. Moreover, the patterning of the two etch target films requires two photolithography processes to be performed. Further, since each of the photolithography processes uses a photomask, two photomasks are required for the above patterning process.

Thus, the above-described patterning method of the conventional/related art, requires a corresponding number of photolithography steps or processes to be performed for forming each photoresist pattern, thereby resulting in a complicated process when one seeks to form two or more photoresist patterns.

Accordingly, there is a need in the art for a more simplified method for fabricating a semiconductor device in comparison to the above-described methods of the conventional/related art. In particular, there is a need for a method for fabricating a semiconductor device, wherein two or more different photoresist patterns can be formed without performing a corresponding number of photolithography steps, thereby reducing the number of steps to be performed and also the number of photomasks to be used in comparison to the conventional/related art.

SUMMARY OF THE INVENTION

In an exemplary embodiment of the present invention, a method of fabricating a semiconductor device is provided. In the method, at least one etch target film is formed on a substrate. Thereafter, a first reflowable etch mask is formed on the at least one etch target film. The etch target film is patterned using the first reflowable etch mask. The first reflowable etch mask is reflowed to form a second etch mask. Thereafter, the etch target film is patterned using the second etch mask. The first etch mask may be formed by patterning a photoresist film. The reflow may be performed by a thermal treatment of the first photoresist pattern. In addition, the thermal treatment may be performed at a temperature range of about 120° C.-about 140° C.

In some exemplary embodiments, a thin film transistor is formed serving as a switching element for each pixel in an LCD.

In another exemplary embodiment of the present invention, a method of fabricating a semiconductor device is provided. The method includes forming a gate electrode and a gate insulating film on a substrate. Thereafter, a semiconductor film and a conductive film are formed on the gate insulating film. A first reflowable etch mask is also on the conductive film. The conductive film is patterned using the first reflowable etch mask to form a source electrode and a drain electrode. The first reflowable etch mask is reflowed to form a second etch mask. Thereafter, the semiconductor film is patterned using the second etch mask.

The semiconductor film may include an ohmic contact film containing impurity ions, which is separated at a portion between the source electrode and the drain electrode. Since the second etch mask is formed by reflowing the first etch mask, the second etch mask is not uniform in thickness along its entirety. Accordingly, by removing the second etch mask by a constant thickness along its entirety, it is possible to remove only a thin portion of the second etch mask between the source electrode and the drain electrode. In this state, the semiconductor film is again etched to form the separated ohmic contact film.

BRIEF DESCRIPTION OF THE DRAWINGS

The accompanying drawings, which are included to provide a further understanding of the invention and are incorporated in and constitute a part of this application, illustrate exemplary embodiment(s) of the invention and together with the description serve to explain the principle of the invention. In the drawings.

DETAILED DESCRIPTION OF THE EXEMPLARY EMBODIMENTS OF THE INVENTION

The exemplary embodiments of the present invention will now be described more fully with reference to the accompanying drawings, in which exemplary embodiments of the invention are shown. The invention may, however, be embodied in many different forms. Accordingly, the invention should not be construed as being limited to the embodiments set forth herein. In the drawings, the thicknesses of layers and regions are simplified or exaggerated for clarity. Like reference numerals in the drawings denote like elements, and thus their description will be omitted.

FIGS. 2A to 2D are sectional views illustrating a method of fabricating a semiconductor device according to an exemplary embodiment of the present invention.

Figure 2A:
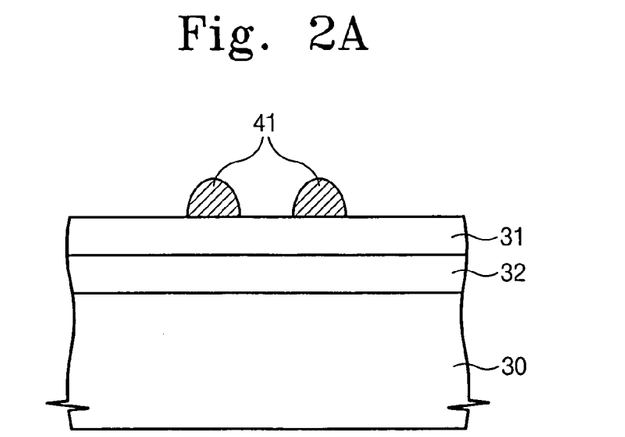
FIGS. 2A to 2D are sectional views illustrating a method of fabricating a semiconductor device according to an exemplary embodiment of the present invention.

Referring to FIG. 2A, a first etch target film 31 and a second underlying etch target film 32 are formed on a substrate 30. The substrate 30 is a place where a variety of devices and interconnection lines are formed. For example, the substrate 30 may be a semiconductor substrate made of silicon or a glass substrate used in an LCD or the like. The first etch target film 31 and the second etch target film 32 are films patterned by an etch, and may be a metal film, an insulating film or the like. Although FIG. 2A shows that only the first and second etch target films 31 and 32 are formed on the substrate 30, another film may be interposed between the substrate 30 and the second etch target film 32 or between the first etch target film 31 and the second etch target film.

A reflowable etch mask is formed on the first etch target film 31. The reflowable etch mask can be formed using a photoresist film. For example, using a conventional photolithography process, a photoresist film is coated on the first etch target film 31, the coated photoresist film is exposed to light that passes through a photomask to remove the exposed portion of the coated photoresist film, so that a photoresist pattern 41 is formed.

Figure 2B:
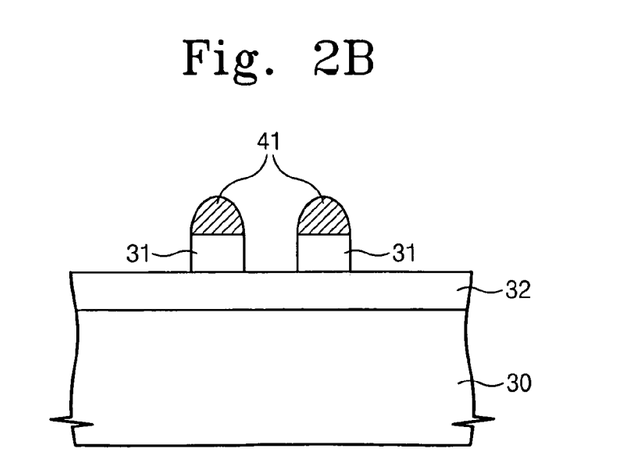

Referring to FIG. 2B, the first etch target film 31 is etched using the first photoresist pattern 41 as an etch mask. A shielded portion beneath the first photoresist pattern 41 is left and an exposed portion not having the photoresist pattern 41 thereon is removed. The etching of the first etch target film 31 can be performed by any of the following methods, including but not limited to a wet etch, a dry etch and a combination of the wet etch and the dry etch method depending on the kind of the first etch target film 31 being used.

Figure 2C:
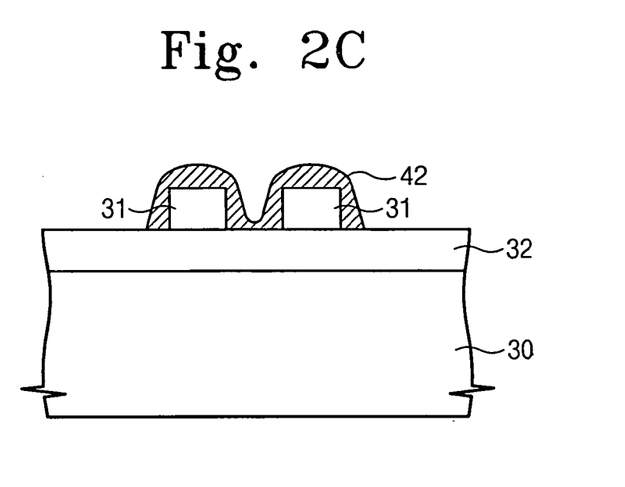

Referring to FIG. 2C, the first photoresist pattern 41 is reflowed to form a second photoresist pattern 42. The reflow of the first photoresist pattern 41 can be induced by a thermal treatment, such as by a bake. When the thermal treatment temperature is too low, it is difficult for the photoresist film to secure its fluidity. When the thermal treatment temperature is too high, the photoresist film has beneficial characteristics in terms of the fluidity but nonetheless the photoresist film is not easy to strip after the patterning of the film has been completed. Considering the above circumstances, it is preferable that the thermal treatment be performed in a temperature range of approximately about 120° C.-about 140° C.

While the thermal annealing is performed, the photoresist film of the first photoresist pattern 41 absorbs heat to have a fluidity such that the photoresist film moves on the first etch target film 31. The second photoresist pattern 42 formed by the reflow can be formed on the position where the first photoresist pattern 41 was formed. Also, since the second photoresist pattern 42 can be further formed on a region expanded due to the fluidity of the photoresist film other than the position where the first photoresist film was formed, the second photoresist pattern 42 becomes different than the first photoresist pattern as a whole.

Figure 2D:
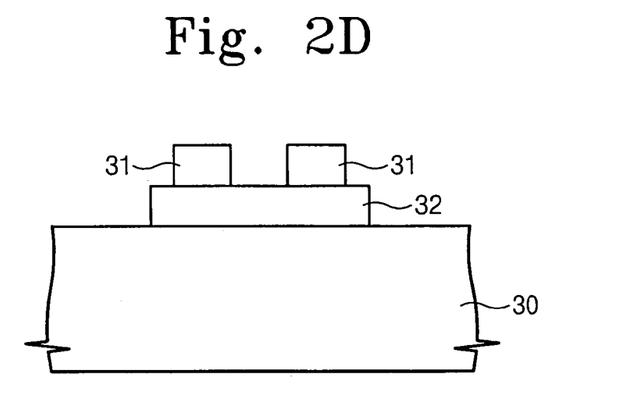

Referring to FIG. 2D, the second etch target film 32 is etched using the second photoresist pattern 42 as an etch mask. As shown in FIG. 2C, the second photoresist pattern 42 is expandable so as to cover sidewalls of the first etch target film 31 left after the etching is performed, thereby preventing the first etch target film 31 from being unnecessarily etched while the second etch target film is etched. After the etching is completed, the first etch target film 31 and the second etch target film 32 on the substrate 30 are patterned differently from each other. Thereafter, the second photoresist pattern 42 is stripped by a method, such as an ashing or the like.

Comparing FIG. 1D with FIG. 2D, they are the same in that the two kinds of films are patterned differently from each other, but have a significant difference in relation to a middle processes. In the former, the photolithography process is performed with respect to each of the first etch target film and the second etch target film, whilst in the latter, only one photolithography process is performed with respect to both of the first etch target film and the second etch target film. In performing one photolithography process, a photoresist film is coated, a soft bake of the coated photoresist film is performed, and then an exposure, a development and a hard bake of the photoresist film are sequentially performed. In the conventional/related art, the above procedure is repeated twice, whereas in the exemplary embodiments of the present invention, the above procedure is performed only once, which results in the simplification of the process. Also, the exposure step of the conventional/related art needs two sheets of photomasks to form the respective photoresist patterns, whilst the exposure step of the exemplary present invention needs only one photomask for the first photoresist pattern, thereby decreasing the number of the photomasks used.

FIGS. 3A to 3E are sectional views illustrating a method of fabricating a semiconductor device according to another exemplary embodiment of the present invention.

Figure 3A:
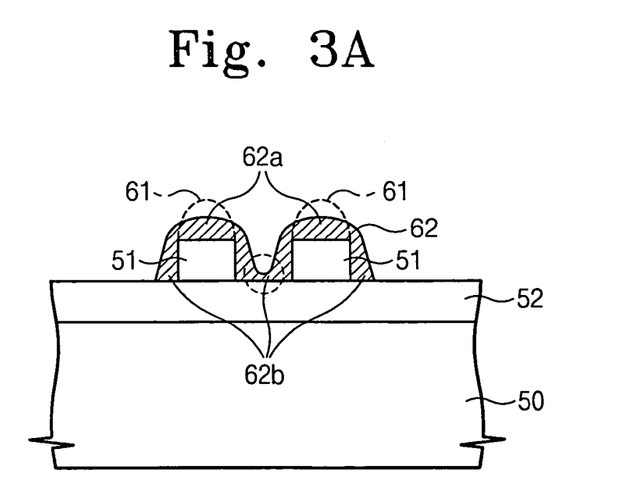
FIGS. 3A to 3E are sectional views illustrating a method of fabricating a semiconductor device according to an exemplary embodiment of the present invention.

Referring to FIG. 3A, a process is performed according to the method described with reference to FIGS. 2A to 2C. In other words, a first etch target film 51 and a second underlying etch target film 52 are formed on a substrate 50. The first etch target film 51 is patterned using a first photoresist pattern (indicated by a dotted line) 61 and then a reflow of the first photoresist pattern 61 is performed to form a second photoresist pattern 62.

Then, the second photoresist pattern 62 formed by the reflow of the first photoresist pattern 61 is formed on a position (hereinafter referred to as 'first region') 62a where the first photoresist pattern 61 was formed, and extends to another position (hereinafter referred to as 'second region') 62b other than the first region 62a. Accordingly, the second photoresist pattern 62 is not uniform in thickness. For instance, the thickness of portions of the second photoresist pattern are different from other portions of the second photoresist pattern. The above thickness refers to the length of the vertical direction. In particular, the second region 62b includes a portion (indicated by a dotted circle), which was separated between the first regions 62a but is combined by the reflow of the first photoresist pattern 61. In the above portion, the photoresist film 62 is formed very thin compared with other portions. Thus, the fact that the second photoresist pattern 62 in the first region is different in thickness than that in the second region 62b can be utilized in patterning the etch target films 51 and 52.

Figure 3B:
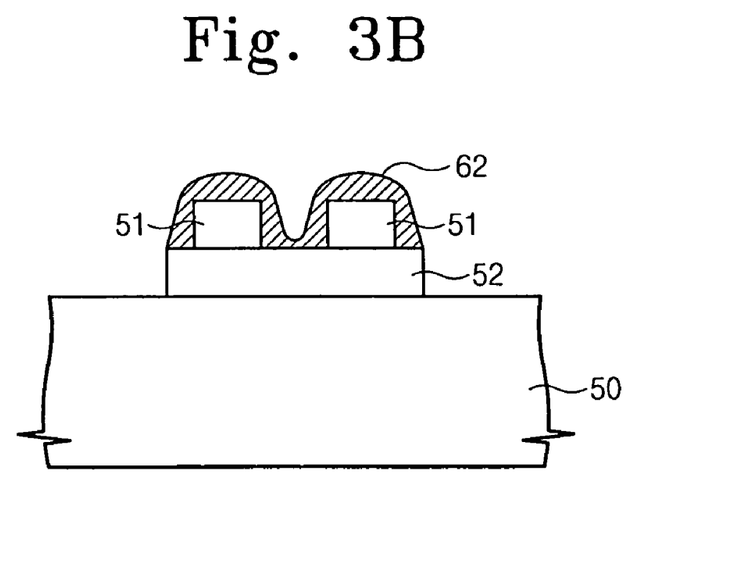

Referring to FIG. 3B, the second etch target film 52 is etched using the second photoresist pattern 62 as an etch mask, so that the second etch target film 52 is patterned differently from the first etch target film 51.

Figure 3C:
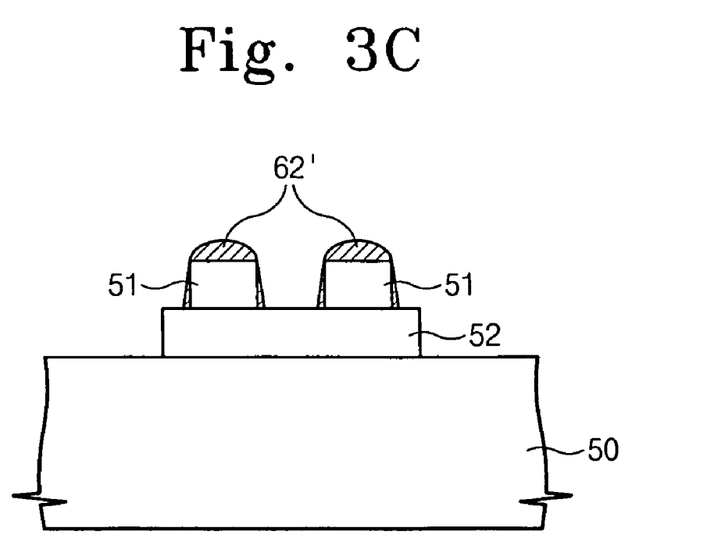

Referring to FIG. 3C, the second photoresist pattern 62 is removed by the same thickness along its entirety. Here, since the second photoresist pattern 62 is not uniform in vertical thickness along its entirety, the second etch target film 52 positioned below portions whose vertical thickness is thin is thereby exposed. The exposed portions of the second etch target film 52 are determined according to the thickness distribution in the entire region of the second photoresist pattern 62 and the removed thickness in the second photoresist pattern 62. In other words, the present step can be controlled such that only a desired region of the second etch target film 52 is exposed. Also, through the present step, a second modified photoresist pattern 62' is formed.

Figure 3D:
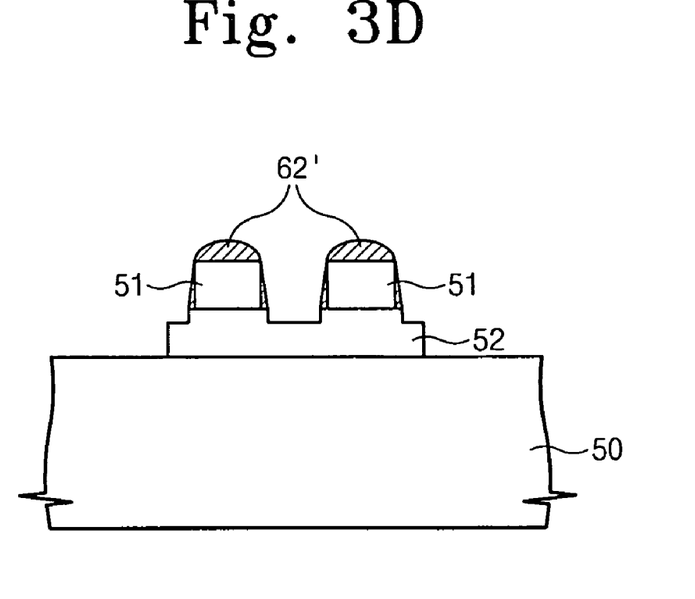

Referring to FIG. 3D, the second etch target film 52 is etched using the second modified photoresist pattern 62' as an etch mask. Then, in the step described with reference to FIG. 3C, by slightly removing the second photoresist pattern 62, a part of the second etch target film 52 located in a position overlapping the second region 62b can be exposed. Accordingly, the step of FIG. 3C may be included in the present step and be consecutively performed along with the present step. For example, if the second etch target film 52 is etched by a dry etch and an etch selectivity exists between the second photoresist pattern 62 and the second etch target film 52, the step of etching the second photoresist pattern 62 by a constant thickness and the step of etching the second etch target film 52 using a different process gas can each be performed in situ. Further, the step (see FIG. 3B) of etching the second etch target film 52 using the second photoresist pattern 62 as an etch mask may be included in the above steps (FIGS. 3C and 3D) and may also be performed in situ.

Figure 3E:
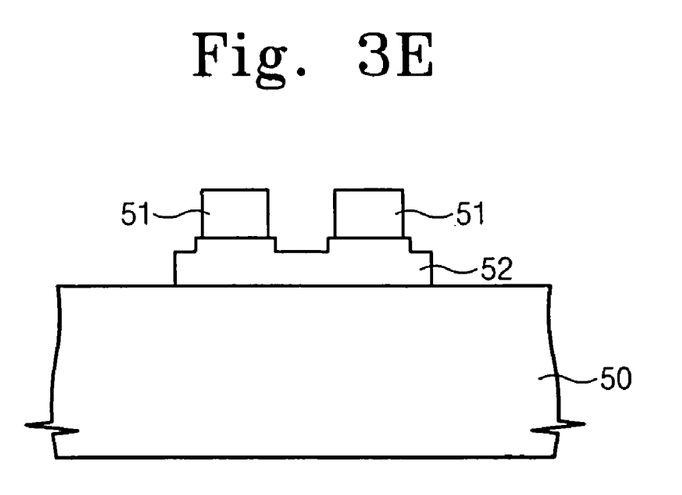

Referring to FIG. 3E, the second modified photoresist pattern 62' is stripped. As a result, the first etch target film 51 is patterned differently from the second etch target film 52 so that the second etch target film 52 may not be uniform along its entirety.

As described above, with the exemplary embodiments of the present invention, the number of photolithography processes and/or the number of photomasks can be decreased and at the same time a variety of patterns can also be formed. The target films are not limited to two kinds of films as in the above exemplary embodiment but may be extended to three or more kinds of target films.

Hereinafter, an example in which the fabrication method of the exemplary embodiments of the present invention is applied to a concrete semiconductor device will now be described. Also, while a thin film transistor (TFT) used in a liquid crystal display (LCD) displaying an image using liquid crystal will be described as an example of the aforementioned semiconductor device, it will be apparent that the fabrication method of the exemplary embodiments of the present invention is not limited thereto but rather can be applied to other semiconductor devices as well.

An LCD is a display, which converts an input electrical signal into visual information to display an image by using the characteristic of the light transmittance of liquid crystals, (liquid crystals being an intermediate phase between liquid and crystal). The light transmittance of the liquid crystals is varied depending upon the applied voltage thereto. The LCD includes two substrates each having an electrode, and liquid crystals interposed between the two substrates. Different voltages are applied to the two substrates to apply an electric field to the liquid crystals, so that liquid crystal molecules are re-aligned to thereby change the light transmittance of these crystals. Thus, the LCD is a lightweight and slim device, which has a low power consumption, compared with other displays having the same screen size. Accordingly, the use of the LCD in recent years, has increased.

Figure 4:
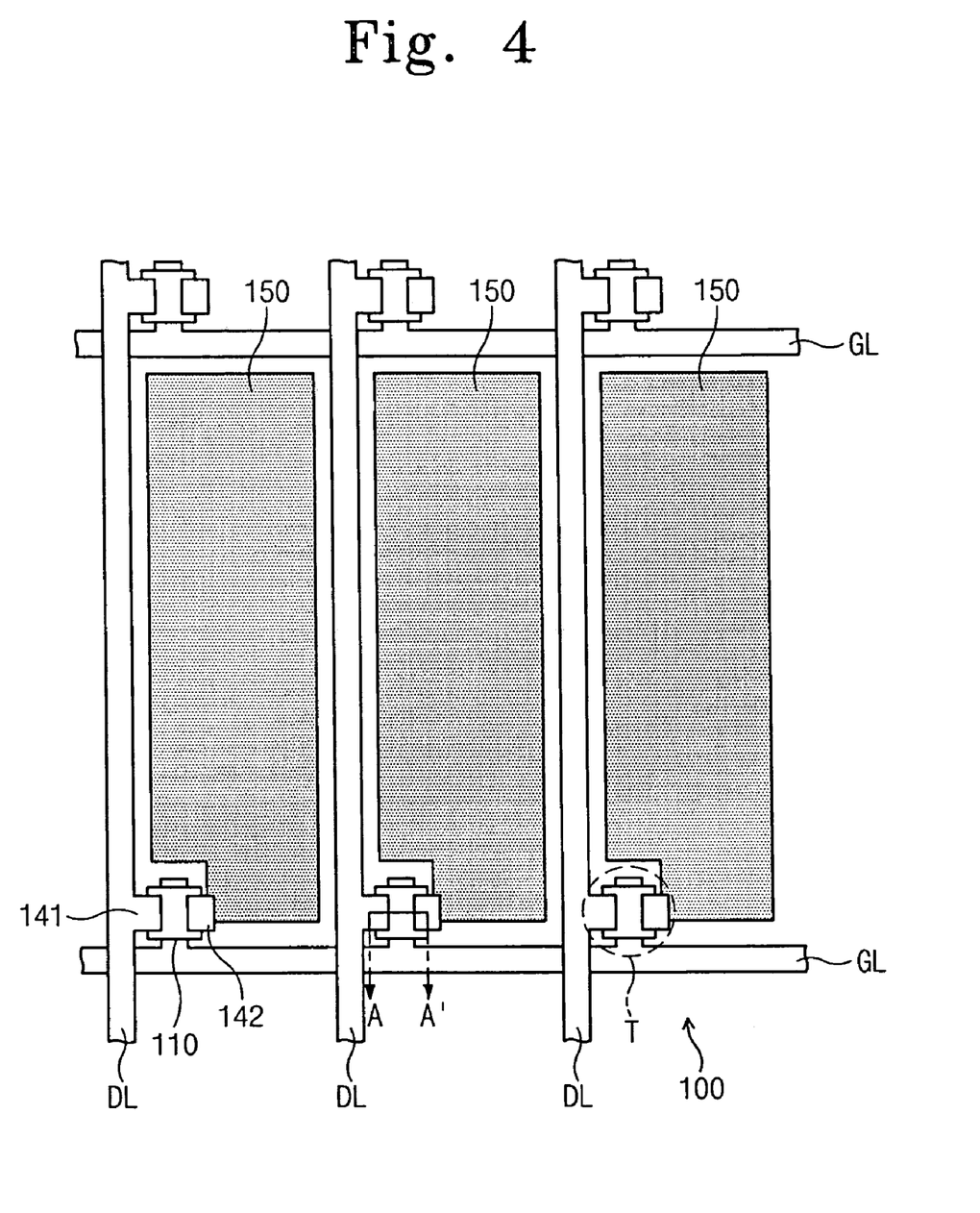
FIG. 4 is a plane view of an LCD to which a method of fabricating a TFT according to an exemplary embodiment of the present invention is applied.

FIG. 4 is a plane view of an LCD to which a method of fabricating a TFT according to an exemplary embodiment of the present invention has been applied, and also illustrates a substrate on which pixel regions are formed.

Referring to FIG. 4, a plurality of gate lines 'GL' and a plurality of data lines 'DL' are arranged crossing each other in a horizontal direction and a vertical direction on a substrate 100. Pixel regions are defined by the plurality of gate lines 'GL' and the plurality of data lines 'DL' crossing each other. Each pixel region is provided with a thin film transistor 'T' and a pixel electrode 150.

Operation of the LCD having the above construction will now be described.

First, as a gate-on signal is applied to the plurality of gate lines 'GL' and the thin film transistors 'T' are turned on, a data voltage of the data lines 'DL' is also applied to the pixel electrodes 150 through the thin film transistors 'T'. Meanwhile, a separate substrate having a common electrode formed thereon is disposed above the pixel electrodes 150. As a reference voltage is applied to the common electrode, the alignment of the liquid crystal molecules are changed by an electric field corresponding to a difference between voltages applied to the pixel electrodes 150 and the common electrode.

As shown in FIG. 4, thin film transistors 'T' are provided, one in each pixel to perform a switching operation for independently operating each pixel. Each thin film transistor 'T' includes a gate electrode 110 extending from the gate line 'GL', a source electrode 141 extending from the data line 'DL', and a drain electrode 142 facing the source electrode 141. The LCDs are generally classified as bottom gate type LCDs or top gate type LCDs. With bottom gate type LCDs, the gate electrode 110 is positioned below the source electrode 141 or the drain electrode 142, depending on the position of the gate electrode. As for top gate type LCDs, the gate electrode 110 is positioned above the source electrode 141 or the drain electrode 142, depending on the position of the gate electrode 110. In another exemplary embodiment of the present invention, a method of fabricating a bottom gate type thin film transistor 'T' will be described. To fabricate a bottom gate type thin film transistor 'T' according to the conventional/related art, five photomasks are generally needed. In recent years, a four mask process using a slit mask has been developed. According to the method of the exemplary embodiments of the present invention using the above-mentioned reflow, only a total of four photomasks are utilized. Although the method of the exemplary embodiments of the invention using the reflow utilizes the same number of photomasks as the conventional/related art using the slit mask, the method of the exemplary embodiments of the present invention can be more easily embodied and can be performed using a fewer number of steps than the above described conventional/related methods.

FIGS. 5A to 5I are sectional views illustrating a method of fabricating the TFT of FIG. 4, and is taken along the line A-A' of FIG. 4.

Figure 5A:
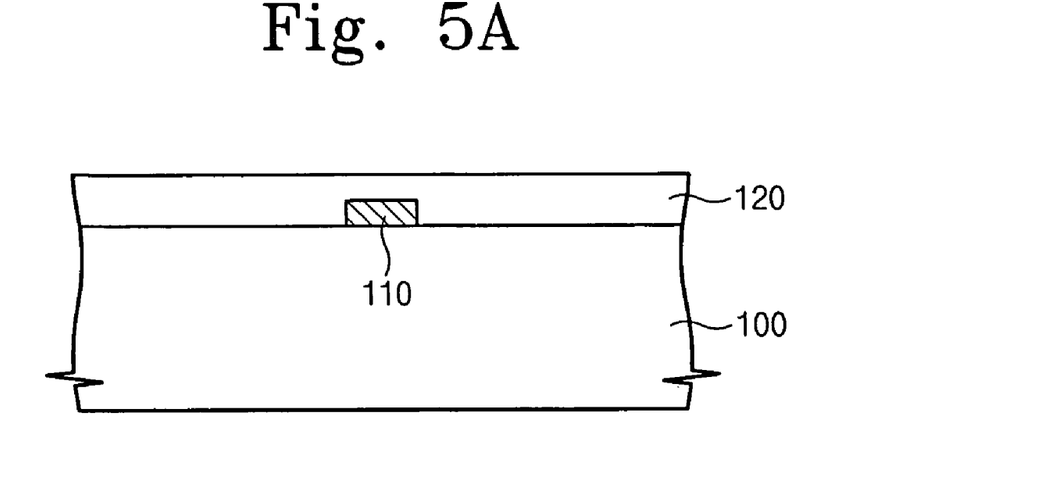
FIGS. 5A to 5I are sectional views illustrating a method of fabricating the TFT of FIG. 4.

Referring to FIG. 5A, a gate electrode 110 and a gate insulating film 120 are formed on a substrate 100. The substrate 100 may be a transparent insulation substrate of glass or the like. The gate electrode 110 is formed by depositing a conductive film, such as chromium (Cr), using sputtering and patterning the deposited conductive film. The gate insulating film 120 is mainly formed of silicon nitride using a chemical vapor deposition process. In patterning the conductive film so as to form the gate electrode 110, one photomask is used.

Figure 5B:
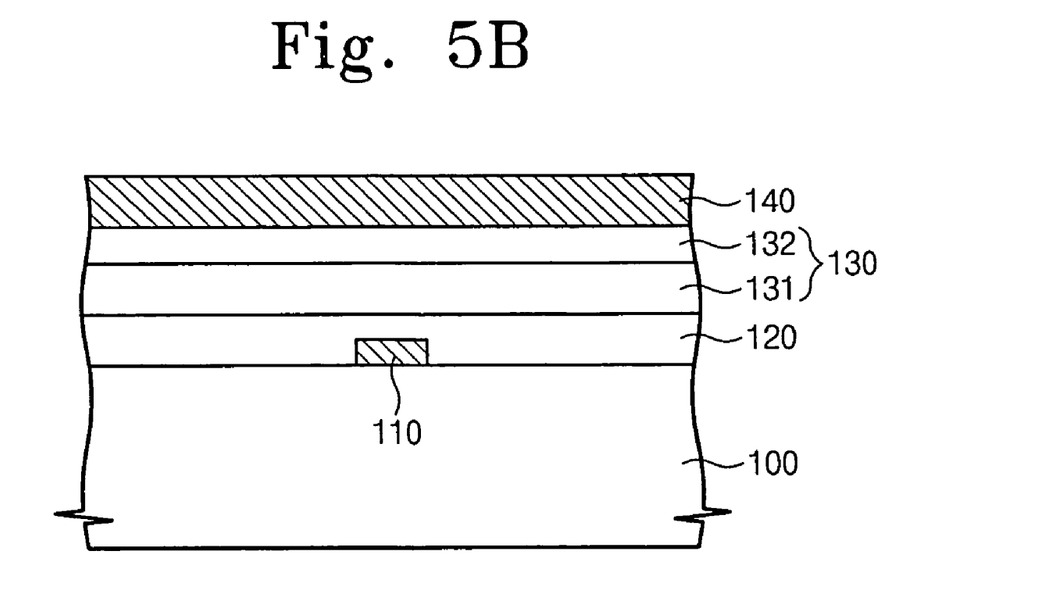

Referring to FIG. 5B, a semiconductor film 130 and a conductive film 140 are formed on the gate insulating film 120. The semiconductor film 130 is formed of amorphous silicon, and includes an active layer 131 forming a channel region for a thin film transistor and an ohmic contact layer 132 containing impurity ions and having the conductivity. The conductive film 140 is formed of the same material as that of the gate electrode 120 by a sputtering method. The conductive film 140 is then used to form a source electrode and a drain electrode.

Figure 5C:
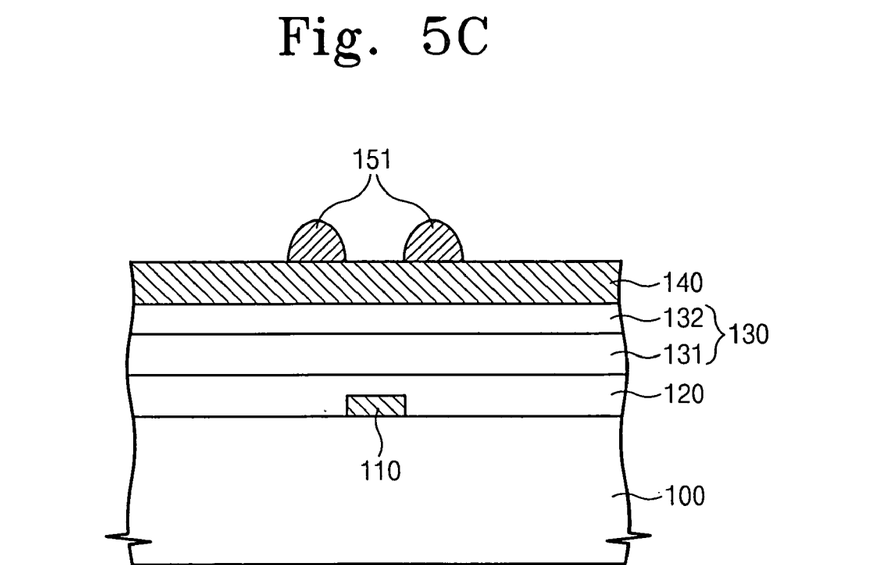

Referring to FIG. 5C, a reflowable etch mask is formed on the conductive film 140. The reflowable etch mask can be formed of a photoresist material. For example, a photoresist film is coated on the conductive film 140 and is exposed to light passing through a photomask, and the portion exposed to the light is removed to form a first photoresist pattern 151.

Figure 5D:
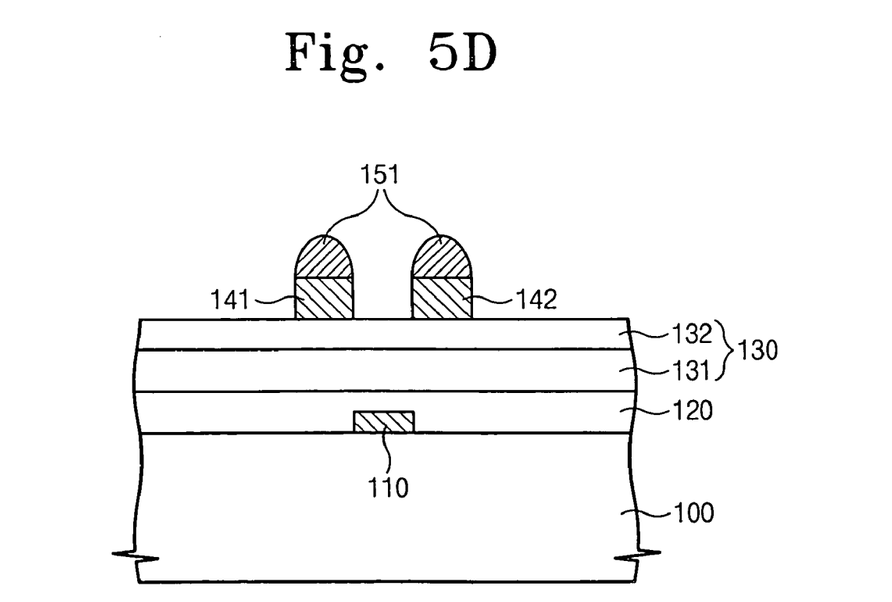

Referring to FIG. 5D, the conductive film 140 is etched using the first photoresist pattern 151 as a mask to form a source electrode 141 and a drain electrode 142. Herein, the conductive film 140 is etched by a wet etch method. Further, the source electrode 141 and the drain electrode 142 may be formed even at a position partially overlapping the gate electrode 110.

Figure 5E:
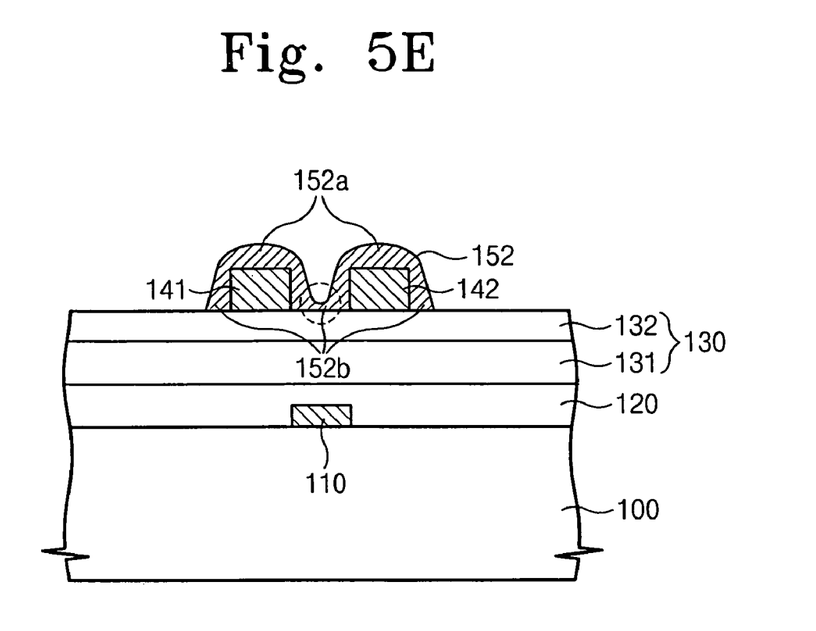

Referring to FIG. 5E, a reflow of the first photoresist pattern 151 is performed to form a second photoresist pattern 152. The reflow can be caused by a thermal treatment, such as a bake. At this stage, if the thermal treatment temperature is too low, the photoresist film will have difficulty in securing the fluidity. However, if the thermal treatment temperature is too high, this is beneficial in terms of the fluidity for the photoresist film, but the photoresist film will not be easy to strip after the patterning is completed. Considering the above circumstances, it is preferable that the thermal treatment be performed in the range of approximately about 120°-about 140° C.

Likewise in the previously described exemplary embodiment, the second photoresist pattern 152 formed by the reflow of the first photoresist pattern 151 can be formed on a position (hereinafter referred to as 'first region') 152a where the first photoresist pattern 151 was formed, and may extend to another position (hereinafter referred to as 'second region') 152b other than the first region 152a.

Accordingly, the second photoresist pattern 152 is not uniform in vertical thickness along its entirety. In particular, the second region 152b includes a portion (indicated by a dotted circle), which was separated between the first regions 152a but is combined by the reflow of the first photoresist pattern. In the above portion, the photoresist film is formed very thin compared with other portions. Herein, the first region 152a corresponds to a position where the source electrode 141 and the drain electrode 142 are formed, and the second region 152b corresponds to a position between the source electrode 141 and the drain electrode 142.

Figure 5F:
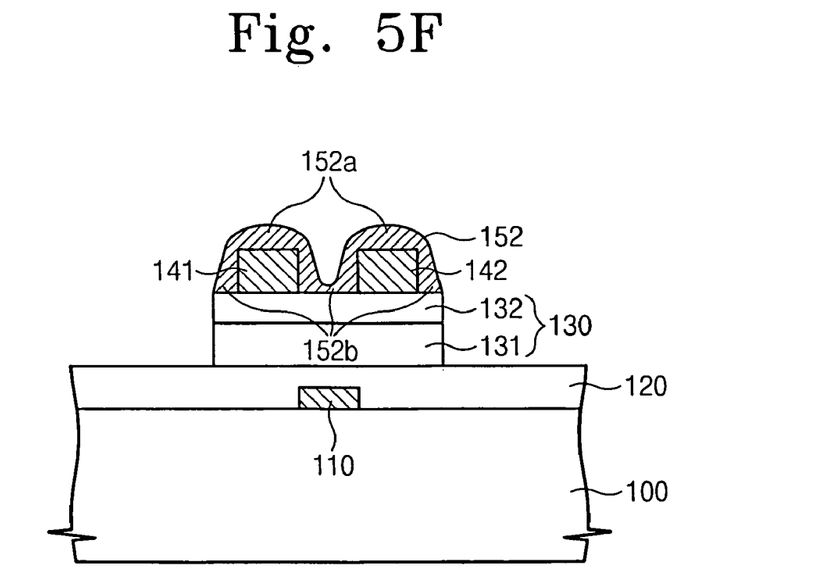

Referring to FIG. 5F, the semiconductor film 130 is etched using the second photoresist pattern 152 as an etch mask. The semiconductor film 130 can be etched by a dry etch, such as a plasma or a reactive ion etch.

Figure 5G:
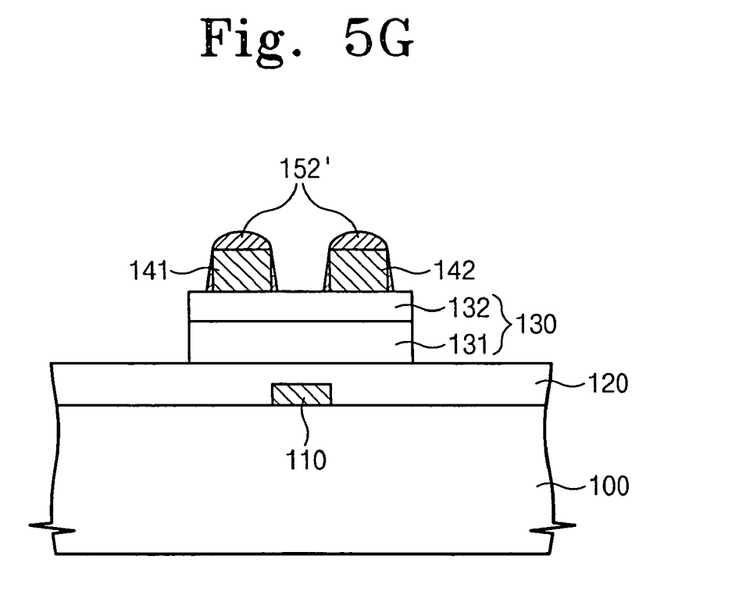

Referring to FIG. 5G, the second photoresist pattern 152 is removed by the same thickness along its entirety until the thin portion of the second region 152b between the source electrode 141 and the drain electrode 142 is completely removed. As a result, a second modified photoresist pattern 152' is formed in which the semiconductor film 130 between the source electrode 141 and the drain electrode 142 is exposed.

Figure 5H:
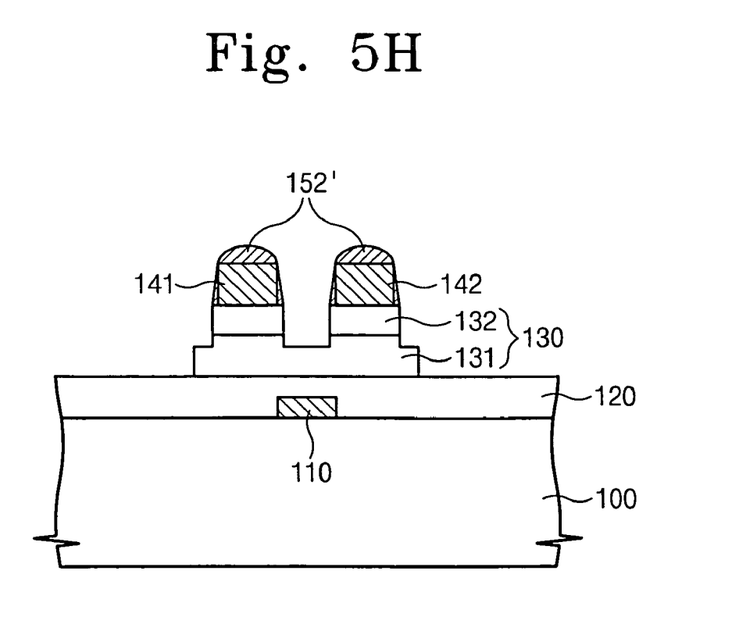

Referring to FIG. 5H, the semiconductor film 130 is partially etched using the second modified photoresist pattern 152' as an etch mask. The exposed portions of the ohmic contact film 132 are completely removed so that the ohmic contact film 132 is divided into two portions overlapping the source electrode 141 and the drain electrode 142. Also, an overetch is performed so that exposed portions of the active film 132 are removed by a predetermined thickness. The active film 131 includes a channel region between the source electrode 141 and the drain electrode 142.

Figure 5I:
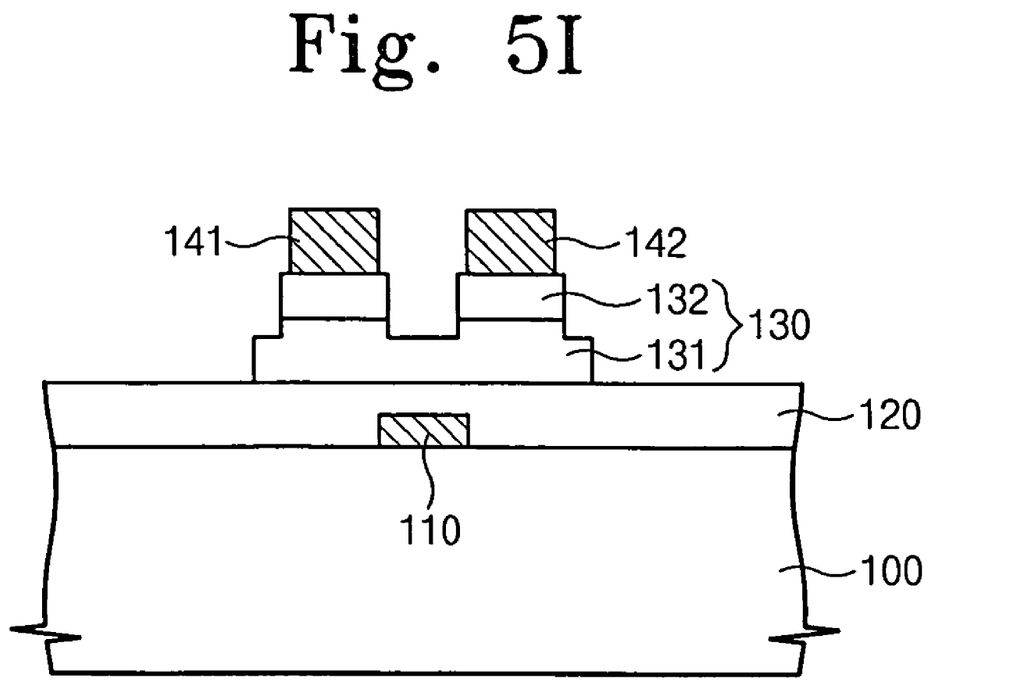

Referring to FIG. 5I, the second modified photoresist pattern 152' is stripped, so that a thin film transistor is completed. Thereafter, a passivation film made of silicon nitride is formed to cover the thin film transistor. Next, a pixel electrode for applying a voltage to liquid crystal is formed on the passivation film. Through the above steps, an LCD including the thin film transistor is completed.

According to the conventional/related art, while forming the thin film transistor, three photomask are needed so as to form the gate electrode 110, the semiconductor film 130, and the source and drain electrodes 141 and 142, and two photomasks are needed so as to pattern the passivation film and the pixel electrode. As a result when using the methods of the conventional/related art, a total of five photomasks are needed. In contrast, in the present exemplary embodiment, only a total of four photomasks are utilized to pattern the passivation film and the pixel electrode, thereby resulting in a decrease in the number of photomasks utilized in comparison to the those required in the methods of the conventional/related art. For instance, with the present exemplary embodiment, only one photomask is utilized to form the gate electrode 110, one photomask is utilized to form the semiconductor film 130 and the source and drain electrodes 141 and 142, and two photomasks are utilized so as to pattern the passivation film and the pixel electrode. Meanwhile, in the case of the slit mask process of the conventional/related art, the semiconductor film 130 and the source and drain electrodes 141 and 142 are formed using one photomask. The slit mask process of the conventional/related art uses a slit mask designed such that light transmittance is varied depending on regions. When using a slit mask, a photoresist pattern is formed in which the thickness is varied depending on its region. In addition, by removing the photoresist pattern such that a thicker portion is left, another photoresist pattern can be formed. Moreover, two different patterns can be formed using one photomask, but nonetheless this slit mask method encounters certain difficulties relating to failure rate and photoresist pattern yield due to the nature of slit photolithography technology.

In contrast with the conventional/related art, since the methods of the exemplary embodiments of the present invention do not use such a slit mask, they can be embodied with ease, increase photoresist pattern yield, and are more simplified in comparison to the methods of the conventional/related art. Also, in FIG. 4E, since the portion of the second photoresist pattern 152 between the source region 141 and the drain region 142 is very thin, the step (see FIG. 5G) of removing the second photoresist pattern 152 by a constant thickness can be included in the step (see FIG. 5H) of etching the semiconductor film 130, and thus the two steps can be performed in situ. In other words, since the semiconductor film 130 is etched by a dry etch, the second photoresist pattern 152 is partially removed and then the semiconductor film 130 can be etched using a different process gas. Further, the step (see FIG. 5F) of etching the semiconductor film 130 such that the semiconductor film 130 is patterned to leave the portion overlapping the gate electrode 120 according to the second photoresist pattern 152 may be included in the above step (FIG. 5H) and be performed in situ.

As described above, according to the exemplary embodiments of the present invention, two or more different photoresist patterns can be formed by using only one photomask via the reflow of the photoresist film. At this stage, the reflow is caused by a thermal treatment. There is no particular limit regarding the temperature range of the thermal treatment. However, it is preferable to perform the heat treatment in the range of about 120°-about 140° C. for purposes relating to the fluidity and stripping of the photoresist film. A general photosensitive film reflows in a high temperature above 150° C., but a photoresist film that easily causes the reflow in the temperature range of 120-140° C. will now be described. It is noted that the photoresist film to be described hereinbelow can be used in a four photomask process or a variety of photolithography processes as well as in the processes of the exemplary embodiments of the present invention.

The photoresist includes a polymer resin for forming a film, an organic solvent for dissolving the polymer, a photosensitive compound sensitively responding to light, and a heat-resistant additive. For the photoresist to have the fluidity in the temperature range of about 120° C.-about 140° C., it is preferable that the photoresist be made in a composition having weak attractive forces between the molecules. When the photoresist was prepared having a composition including about 5-about 30% by weight of polymer resin, about 2-about 10% by weight of photosensitive compound, about 0.5-about 3% by weight of heat-resistant additive, and about 60-about 90% by weight of organic solvent, it was demonstrated from experimental examples that the above photoresist has superior reflow characteristics in comparison to a conventional photoresist. The experimental examples are set forth in detail below. For example, herein, the polymer may be a novolac resin, the photosensitive compound may be a diazide compound, the heat-resistant additive may be a bisphenol compound, and the organic solvent may be a propylene glycol methyl ether acetate).

The polymer resin is a polymer synthesized by reacting an aromatic alcohol including meta cresol and para cresol with formaldehyde. The polymer resin has a molecular weight of about 2000-about 5000, is significantly lower molecular weight, compared to a polymer resin having a molecular weight of about 7000-about 8000. Also, the novolac resin may be prepared in a ratio of about 60 parts by weight of meta cresol to about 40 parts by weight of para cresol, which corresponds to a change from the general composition ratio of the novolac resin, i.e., 40 parts by weight of meta cresol to 60 parts by weight of para cresol. Increase of the meta cresol above 50 parts by weight can enhance the reflow characteristic and the like.

The photosensitive compound is a diazide compound having the below chemical formula:

Chemical formula 1

The photosensitive compound may include 2,2'-methylenebis[6-[(2-hydroxy-5-methylphenyl)methyl]-4-methyl-1,2-naphthoquinonediazide-5-sulfonate to enhance the fluidity of the photoresist.

The heat-resistant additive is a bisphenol compound having the chemical formula 2 or 3:

Chemical formula 2

R: Methyl, Enthyl

Chemical formula 3

R1: Methyl, ethyl, propyl, butyl, pentyl, hexyl
R2: H, Methyl

The heat-resistant additive may include 2,2'-methylenebisphenol or 4,4'-(1-methyl-heptyliden)bisphenol and it lowers a liquefaction temperature of the polymer resin or the like.

Set forth below are experimental examples 1-4, in accordance with exemplary embodiments of the present invention. These experimental examples correspond to examples of photoresists designed to have a composition ratio suitable for the exemplary embodiments of the present invention. Further, comparative example 1 corresponds to an example of a photoresist having a general composition ratio.

Experimental Example 1

A novolac resin having a molecular weight of 4000, which was a product synthesized in a ratio of 60 parts by weight of meta cresol to 40 parts by weight of para cresol is mixed with a 20 parts by weight of photosensitive compound, 2,2'-methylenebis[6-[(2-hydroxy-5-methylphenyl)methyl]-4-methyl-1,2-naphthoquinonediazide-5-sulfonate to obtain a mixture.

The mixture was dissolved in an organic solvent of propyleneglycolmonomethyletheracetate such that the solid component has a concentration of 30 parts by weight, and then filtered using a 0.2 µm milipore filter.

Experimental Example 2

Comparing with the experimental example 1, a novolak resin having the molecular weight of 3000 was used and the photosensitive compound was mixed at a rate of 23 parts by weight.

Experimental Example 3

In addition to the condition provided in the experimental example 2, 2 parts by weight of 2,2'-methylenebisphenol was further added as a heat-resistant additive.

Experimental Example 4

In addition to the condition provided in the experimental example 2,2 parts by weight of 4,4'-(1-methyl-heptyliden) bisphenol was further added as a heat-resistant additive.

Comparative Example 1

A novolac resin having a molecular weight of 6000, which was a product synthesized in a ratio of 40 parts by weight of meta cresol to 60 parts by weight of para cresol, is mixed with 18 parts by weight of photosensitive compound (2,3,4,4'-tetrahydroxybenzophenone-1,2-naphthoquinonediazide-5-sulfonate and 2,3,4-tetrahydroxybenzophenone-1,2-naphthoquinonediazide-5-sulfonate) to obtain a mixture. The novalac resin and the photosensitive compound were mixed in a ratio of 50 to 50. The mixture was then dissolved in an organic solvent of propyleneglycolmonomethyletheracetate such that the solid component has a concentration of 30 parts by weight, and then filtered using a 0.2 µm milipore filter.

The following table 1 shows test results for the experimental examples and the comparative example.

TABLE 1

| | Sensitivity (mJ/cm$^2$) | Adhesive force (nm) | Heat resistivity (tan θ) |
|---|---|---|---|
| Experimental ex. 1 | 37.0 | 425 | 31 |
| Experimental ex. 2 | 35.5 | 395 | 29 |
| Experimental ex. 3 | 34.0 | 485 | 27 |
| Experimental ex. 4 | 33.0 | 470 | 28 |
| Comparative ex. 1 | 35.0 | 529 | 39 |

The sensitivity was measured by performing an exposure step and a development step using a sensitivity mask. The experimental examples 1 to 4 and the comparative example do not have a significant difference in sensitivity, which indicates that the variations in composition shown in experimental examples 1 to 4 do not cause a significant variation in sensitivity.

The adhesive force was measured as a length of a portion removed by a wet etch method. For example, when a molybdenum (Mo) film is deposited on a substrate and the deposited Mo film is wet-etched using a photoresist pattern, the adhesive force is measured as a length of a portion of the deposited Mo film removed by the wet etch in the portion not exposed by the photoresist pattern. The weaker the adhesive force between the deposited Mo film and the photoresist pattern, the greater the length is of the portion removed by the wet etch in the portions not exposed due to the photoresist pattern. From the results of table 1, it was demonstrated that the adhesive force measured in experimental examples 1 to 4 was higher than the adhesive force measured in comparative example 1.

The heat resistivity was measured as a tangent value of an angle defined by a horizontal plane and the shape of the photoresist pattern at an edge of the photoresist pattern. If the photoresist pattern has a good fluidity, it is spread to a wide range, so that the angle decreases. In Table 1, when the polymer resin has a smaller molecular weight and in particular the heat-resistant additive is added (see experimental examples 3 and 4), it was confirmed that the fluidity was further increased.

As described above, in a method of fabricating a semiconductor device according to the exemplary embodiments of the present invention, two or more different photoresist patterns can be formed by using a reflow of the photoresist pattern without performing a corresponding number of photolithography steps, so that the total number of steps can be reduced.

Having described the exemplary embodiments of the present invention, it is further noted that it is readily apparent to those of reasonable skill in the art that various modifications may be made without departing from the spirit and scope of the invention which is defined by the metes and bounds of the appended claims.

What is claimed is:

1. A method of fabricating a semiconductor device, comprising:
   forming a second etch target film on a substrate;
   forming a first etch target film on the second etch target film;
   forming a first reflowable etch mask on the first etch target film;
   patterning the first etch target film using the first reflowable etch mask;
   reflowing the first reflowable etch mask to form a second etch mask; and
   patterning the second etch target film using the second etch mask,
   wherein the reflowing is induced by performing a thermal treatment of the first reflowable etch mask,
   wherein the thermal treatment is performed at a temperature range of about 120° C. to about 140° C.

2. The method of claim 1, wherein the first reflowable etch mask is formed by patterning a photoresist film.

3. The method of claim 2, wherein the photoresist film is formed of a photoresist comprising about 5-about 30% by weight of a polymer resin, about 2-about 10% by weight of a photosensitive compound, about 0.5-about 3% by weight of heat-resistant additive, and an organic solvent.

4. The method of claim 3, wherein the polymer resin is a novolak resin which comprises meta cresol and para cresol and has a molecular weight of about 2,000-about 5,000.

5. The method of claim 3, wherein the photosensitive compound is a diazide compound.

6. The method of claim 3, wherein the heat-resistant additive is a bisphenol compound.

7. The method of claim 1, wherein the second etch mask is foamed on a first region which is substantially the same in position as the first reflowable etch mask and a second region which is adjacent to the first region and corresponds to a position expanded by the reflowing.

8. The method of claim 7, wherein the second etch target film is patterned so as to be aligned on an edge of the second region.

9. The method of claim 7, wherein the patterning of the second etch target film comprises:
   etching the second etch target film using the second etch mask;
   exposing a portion of the second etch target film overlapping the second region by uniformly removing the second etch mask by a predetermined thickness; and
   etching the exposed portion of the second etch target film by a predetermined thickness.

10. The method of claim 9, wherein the etching of the second etch target film, the uniform removing of the second etch mask, and the etching of the exposed portion of the second etch target film are continuously performed.

11. A method of fabricating a semiconductor device, comprising:
   forming a gate electrode and a gate insulating film on a substrate;
   forming a semiconductor film and a conductive film on the gate insulating film;
   forming a first reflowable etch mask on the conductive film;
   patterning the conductive film using the first reflowable etch mask to form a source electrode and a drain electrode;
   reflowing the first reflowable etch mask to form a second etch mask; and
   patterning the semiconductor film using the second etch mask,
   wherein the reflowing is induced by performing a thermal treatment of the first reflowable etch mask,
   wherein the second etch mask is formed on a first region which is substantially the same in position as the first reflowable etch mask and a second region which is adjacent to the first region and which corresponds to a position expanded by the reflowing, and
   wherein the patterning of the semiconductor film comprises:
   etching the semiconductor film using the second etch mask;
   exposing a portion of the second etch target film overlapping the second region by uniformly removing the second etch mask by a predetermined thickness; and
   etching the exposed portion of the semiconductor film by a predetermined thickness.

12. The method of claim 11, wherein the first reflowable etch mask is formed by patterning a photoresist film.

13. The method of claim 12, wherein the thermal treatment is performed at a temperature range of about 120° C.-about 140° C.

14. The method of claim 12, wherein the photoresist film is formed of a photoresist comprising about 5-about 30% by weight of a polymer resin, about 2-about 10% by weight of a photosensitive compound, about 0.5-about 3% by weight of a heat-resistant additive, and an organic solvent.

15. The method of claim 14, wherein the polymer resin is a novolak resin which comprises meta cresol and para cresol and has a molecular weight of about 2,000-about 5,000.

16. The method of claim 14, wherein the photosensitive compound is a diazide compound.

17. The method of claim 14, wherein the heat-resistant additive is a bisphenol compound.

18. The method of claim 11, wherein the semiconductor film is patterned so as to be aligned on an edge of the second region.

19. The method of claim 11, wherein the semiconductor film comprises an active layer forming a channel region and an ohmic contact layer formed at an upper portion of the semiconductor film and including impurity ions.

20. The method of claim 19, wherein the etching of the exposed portion of the semiconductor film comprises removing an exposed portion of the ohmic contact layer.

21. The method of claim 11, wherein the etching of the semiconductor film using the second etch mask, the uniform removing of the second etch mask, and the etching of the exposed portion of the semiconductor film are continuously performed.

22. The method of claim 11, wherein the semiconductor film is formed of amorphous silicon.

* * * * *